United States Patent
Jha et al.

(10) Patent No.: US 10,246,772 B2
(45) Date of Patent: Apr. 2, 2019

(54) PLASMA ENHANCED CHEMICAL VAPOR DEPOSITION OF FILMS FOR IMPROVED VERTICAL ETCH PERFORMANCE IN 3D NAND MEMORY DEVICES

(71) Applicant: Applied Materials, Inc., Santa Clara, CA (US)

(72) Inventors: Praket P. Jha, San Jose, CA (US); Allen Ko, Fremont, CA (US); Xinhai Han, Santa Clara, CA (US); Thomas Jongwan Kwon, Dublin, CA (US); Bok Hoen Kim, San Jose, CA (US); Byung Ho Kil, Gangdong-gu (KR); Ryeun Kim, Wonju-Si (KR); Sang Hyuk Kim, Gyeonggi (KR)

(73) Assignee: APPLIED MATERIALS, INC., Santa Clara, CA (US)

( * ) Notice: Subject to any disclaimer, the term of this patent is extended or adjusted under 35 U.S.C. 154(b) by 268 days.

(21) Appl. No.: 15/063,569

(22) Filed: Mar. 8, 2016

(65) Prior Publication Data
US 2016/0293609 A1    Oct. 6, 2016

Related U.S. Application Data

(60) Provisional application No. 62/141,606, filed on Apr. 1, 2015.

(51) Int. Cl.
*C23C 16/34* (2006.01)
*C23C 16/40* (2006.01)
(Continued)

(52) U.S. Cl.
CPC .......... *C23C 16/345* (2013.01); *C23C 16/401* (2013.01); *C23C 16/45523* (2013.01);
(Continued)

(58) Field of Classification Search
CPC ... C23C 16/345; C23C 16/401; C23C 16/402; C23C 16/50; H05H 1/24
See application file for complete search history.

(56) References Cited

U.S. PATENT DOCUMENTS 7,166,544 B2    1/2007 Padhi et al.
7,776,516 B2    8/2010 Yeh et al.
(Continued)

OTHER PUBLICATIONS

Van den bosch, G., et al., "Highly Scaled Vertical Cylindrical SONOS Cell with Bilayer Polysilicon Channel for 3-D NAND Flash Memory". IEEE Electron Device Letters, vol. 32, No. 11, Nov. 2011.*

(Continued)

*Primary Examiner* — Bret P Chen
(74) *Attorney, Agent, or Firm* — Patterson + Sheridan LLP

(57) ABSTRACT

A method for forming a high aspect ratio feature is disclosed. The method includes depositing one or more silicon oxide/silicon nitride containing stacks on a substrate by depositing a first film layer on the substrate from a first plasma and depositing a second film layer having a refractive index on the first film layer from a second plasma. A predetermined number of first film layers and second film layers are deposited on the substrate. The first film layer and the second film layer are either a silicon oxide layer or a silicon nitride layer and the first film layer is different from the second film layer. The method further includes depositing a third film layer from a third plasma and depositing a fourth film layer on the third film layer from a fourth plasma. The fourth film layer has a refractive index greater than the first refractive index.

20 Claims, 7 Drawing Sheets

(51) Int. Cl.
*H05H 1/24* (2006.01)
*H01L 21/02* (2006.01)
*C23C 16/455* (2006.01)
*H01L 21/311* (2006.01)
*H01L 27/11556* (2017.01)
*H01L 27/11582* (2017.01)

(52) U.S. Cl.
CPC .... *H01L 21/0217* (2013.01); *H01L 21/02164* (2013.01); *H01L 21/02211* (2013.01); *H01L 21/02216* (2013.01); *H01L 21/02274* (2013.01); *H01L 21/31116* (2013.01); *H01L 27/11556* (2013.01); *H01L 27/11582* (2013.01)

(56) References Cited

U.S. PATENT DOCUMENTS

| | | | |
|---|---|---|---|
| 8,076,250 B1* | 12/2011 | Rajagopalan | H01L 21/02164 257/288 |
| 2006/0046520 A1 | 3/2006 | Padhi et al. | |
| 2007/0049043 A1 | 3/2007 | Muthukrishnan et al. | |
| 2008/0020319 A1 | 1/2008 | Yeh et al. | |
| 2008/0299743 A1* | 12/2008 | Miyairi | H01L 21/76254 438/458 |
| 2011/0101442 A1 | 5/2011 | Ganguly et al. | |
| 2011/0272008 A1* | 11/2011 | Mungekar | H01L 31/02168 136/252 |
| 2011/0272024 A1 | 11/2011 | Choi et al. | |
| 2012/0190185 A1* | 7/2012 | Rogers | H01L 21/28273 438/593 |
| 2013/0161629 A1* | 6/2013 | Han | H01L 29/66833 257/66 |
| 2015/0017772 A1* | 1/2015 | Waite | H01L 27/11582 438/269 |
| 2015/0087154 A1* | 3/2015 | Guha | H01L 21/31144 438/703 |
| 2015/0203966 A1 | 7/2015 | Budiarto et al. | |

OTHER PUBLICATIONS

Lai, Hsiang-Yueh, et al., "Operation Characterization of Flash Memory with Silicon Nitride/Silicon Dioxide Stack Tunnel Dielectric". Japanese Journal of Applied Physics, vol. 44, No. 14, 2005, pp. L435-L438.*

Lucovsky, Gerald, "Silicon oxide/silicon nitride dual-layer films: a stacked gate dielectric for the 21st century". Journal of Non-Crystalline Solids 254 (1999) 26-37.*

Sahu, B.S., "Study of thermally grown and photo-CVD deposited silicon oxide-silicon nitride stack layers". Semicond. Sci. Technol. 18 (2003) 670-675.*

* cited by examiner

PLASMA ENHANCED CHEMICAL VAPOR DEPOSITION OF FILMS FOR IMPROVED VERTICAL ETCH PERFORMANCE IN 3D NAND MEMORY DEVICES

CROSS-REFERENCE TO RELATED APPLICATIONS

This application claims benefit of U.S. provisional patent application Ser. No. 62/141,606, filed Apr. 1, 2015. The aforementioned related patent application is herein incorporated by reference in its entirety.

FIELD

Implementations of the present disclosure generally relate to thin films incorporating high aspect ratio feature definitions and methods for forming the same.

BACKGROUND

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

As the density of devices stacked vertically increases, the aspect ratio of features correspondingly increases. Along with the increase in aspect ratios, it becomes more difficult to achieve a uniform etch profile. One traditional approach for achieving a uniform etch profile is the use of a multi-operation etch recipe. The first operation opens the sidewalls followed by subsequent operations of high-energy bombardment to form a straight wall having a uniform etch profile. However, as aspect ratios increase it has become more difficult to achieve a uniform etch profile using traditional multi-operation etch recipes. In another traditional approach a single operation etch recipe with very high ion bombardment is used to provide an anisotropic etch. However, the high energies needed to achieve a straight etch profile using traditional one-step etch recipes leads to plasma damage on the top surface of the structure.

Therefore, there is a need for additional methods for achieving uniform etch profiles.

SUMMARY

Implementations of the present disclosure generally relate to thin films incorporating high aspect ratio feature definitions and methods for forming the same. In one implementation, a method for forming a high aspect ratio feature is provided. The method comprises positioning a substrate in a processing chamber, depositing one or more silicon oxide/silicon nitride containing stacks on a substrate in the presence of a vacuum. Depositing the one or more silicon oxide/silicon nitride containing stacks comprises energizing a first process gas into a first plasma, depositing a first film layer on the substrate from the first plasma, energizing a second process gas into a second plasma, depositing a second film layer on the first film layer from the second plasma, wherein the second film layer has a first refractive index. The above operations are repeated until a predetermined number of first film layers and second film layers have been deposited on the substrate, wherein the first film layer and the second film layer are either a silicon oxide layer or a silicon nitride layer and wherein the first film layer is different from the second film layer. Depositing the one or more silicon oxide/silicon nitride containing stacks further comprises energizing a third process gas into a third plasma, depositing a third film layer on a previous layer from the third plasma, energizing a fourth process gas into a fourth plasma, depositing a fourth film layer on the third film layer from the fourth plasma, wherein the fourth film layer has a refractive index greater than the refractive index of the second film layer and repeating the above operations until a predetermined number of third film layers and fourth film layers have been deposited on the substrate, wherein third film layer and the fourth film layer are either a silicon oxide layer or a silicon nitride layer and wherein the third film layer is different from the fourth film layer.

In another implementation, a film structure having high aspect ratio features is provided. The film structure comprises one or more first silicon oxide/silicon nitride containing stacks formed on a substrate, wherein the one or more first silicon oxide/silicon nitride containing stacks comprise a first film layer formed on the substrate, a second film layer formed on the first film layer, wherein the second film layer has a first refractive index and wherein the first film layer and the second film layer are either a silicon oxide layer or a silicon nitride layer and wherein the first film layer is different from the second film layer. The film structure further comprises one or more second silicon oxide/silicon nitride containing stacks formed on the one or more first silicon oxide/silicon nitride containing stacks, wherein the one or more second silicon oxide/silicon nitride containing stacks comprise a third film layer formed on a previous layer and a fourth film layer formed on the third film layer, wherein the fourth film layer has a refractive index greater than the refractive index of the second film layer and wherein the third film layer and the fourth film layer are either a silicon oxide layer or a silicon nitride layer and wherein the third film layer is different from the fourth film layer.

In yet another implementation, a film structure having high aspect ratio features is provided. The film structure comprises one or more first silicon oxide/silicon nitride containing stacks formed on a substrate, wherein the one or more first silicon oxide/silicon nitride containing stacks comprise a first film layer formed on the substrate and a second film layer formed on the first film layer, wherein the second film layer has a first refractive index and wherein the first film layer and the second film layer are either a silicon oxide layer or a silicon nitride layer and wherein the first film layer is different from the second film layer. The film structure further comprises one or more second silicon oxide/silicon nitride containing stacks formed on the one or more first silicon oxide/silicon nitride containing stacks, wherein the one or more second silicon oxide/silicon nitride containing stacks comprise a third film layer formed on a previous layer and a fourth film layer formed on the third film layer, wherein the fourth film layer has a refractive index greater than the refractive index of the second film layer and wherein the third film layer and the fourth film layer are either a silicon oxide layer or a silicon nitride layer and wherein the third film layer is different from the fourth film layer. The film structure further comprises one or more third silicon oxide/silicon nitride containing stacks formed on the one or more second silicon oxide/silicon nitride containing stacks, wherein the one or more third silicon oxide/silicon nitride containing stacks comprise a fifth film layer formed on a previous layer and a sixth film layer formed on the fifth film layer, wherein the sixth film layer has a refractive index greater than the refractive index of the fourth film layer and wherein the fifth film layer and the sixth film layer are either a silicon oxide layer or a silicon nitride layer and wherein the fifth film layer is different from the sixth film layer, wherein the refractive index of the second film layer is from about 1.85 to about 1.90, the refractive index of the fourth film layer is from about 1.91 to about 1.95, and the refractive index of the sixth film layer is from about 1.95 to about 2.1.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used on other implementations without specific recitation.

DETAILED DESCRIPTION

The following disclosure describes thin films having high aspect ratio features formed therein, processes for the deposition of thin films and formation of high aspect ratio feature therein, and devices for carrying out the aforementioned processes.

Certain details are set forth in the following description and in FIGS. 1-5 to provide a thorough understanding of various implementations of the disclosure. Other details describing well-known methods and systems often associated with the deposition of thin films are not set forth in the following disclosure to avoid unnecessarily obscuring the description of the various implementations.

Many of the details, components and other features described herein are merely illustrative of particular implementations. Accordingly, other implementations can have other details, components, and features without departing from the spirit or scope of the present disclosure. In addition, further implementations of the disclosure can be practiced without several of the details described below.

Other deposition chambers may also benefit from the present disclosure and the parameters disclosed herein may vary according to the particular deposition chamber used to form the 3D NAND gate stacks described herein. For example, other deposition chambers may have a larger or smaller volume, requiring gas flow rates that are larger or smaller than those recited for deposition chambers available from Applied Materials, Inc.

As gate height increases, 3D NAND gate stacks involve very high aspect ratio etching. Due to the current limitations of etching techniques, the vertical etch profile typically tapers as the depth into the gate stack increases. The inventors have devised a unique deposition scheme that compensates for etch performance degradation in deep trenches by a novel plasma-enhanced chemical vapor deposition (PECVD) film deposition method. The inventors have found that by grading various properties (e.g., refractive index, stress of the film, dopant concentration in the film) of the as-deposited films (e.g., silicon nitride) a more uniform etch profile can be achieved by compensating for variations in both dry and wet etch rates. For example, by grading the refractive index from between 1.90 and 2.1 as stack height increases, it has been found that dry and wet etch rates can be modulated by up to 20% leading to a more uniform etch profile. Although described herein in relation to 3D NAND devices, the implementations described herein are also applicable to other deposition-etch integration schemes that demonstrate reduced etch profile uniformity at increased thickness.

Figure 1:
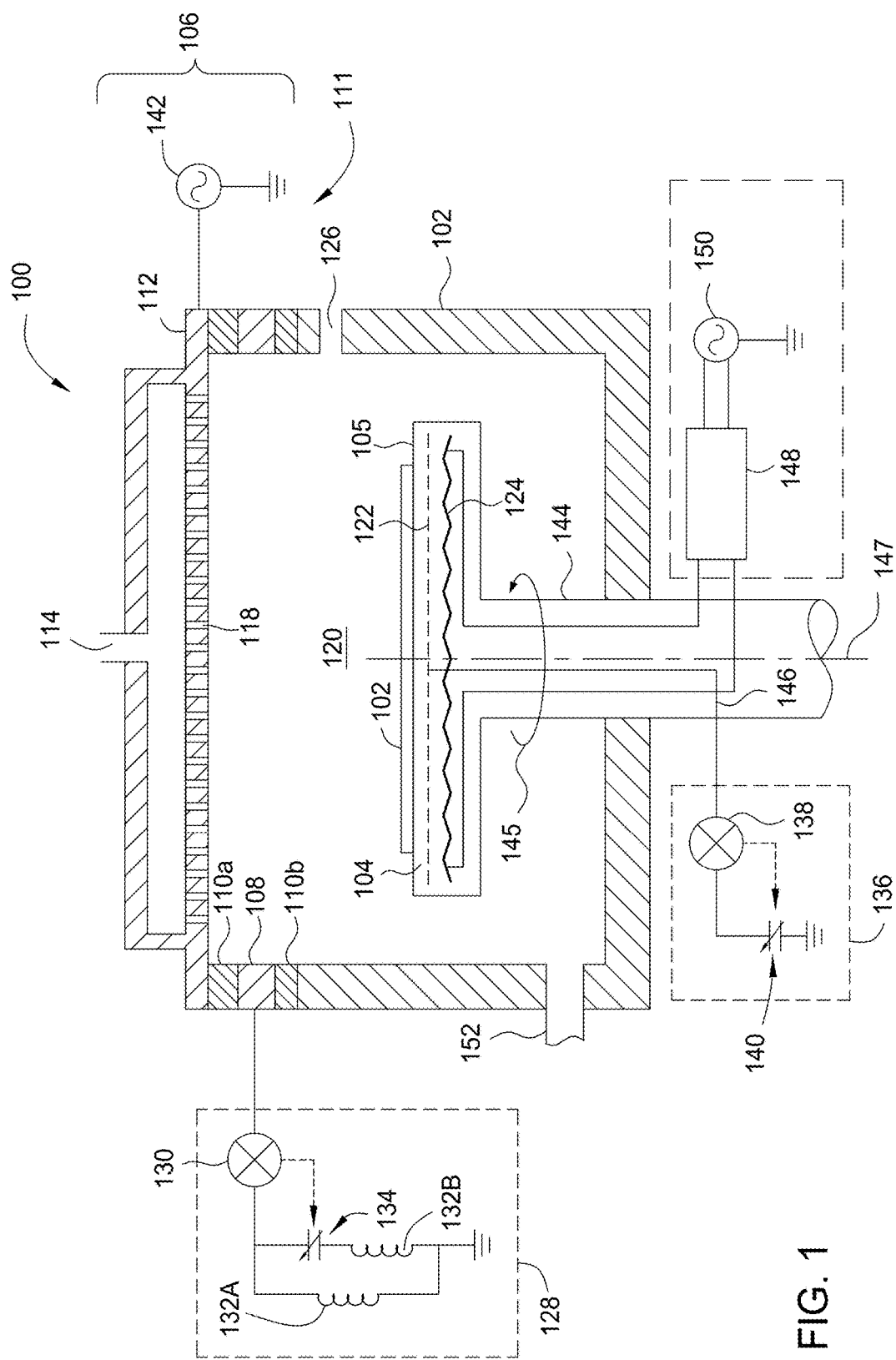
FIG. 1 depicts a schematic side view of a processing chamber that may be utilized to form film layers according to implementations described herein.

FIG. 1 depicts a schematic side view of a processing chamber 100 that may be utilized to form film layers according to implementations described herein. The processing chamber 100 features a chamber body 102, a substrate support 104 disposed inside the chamber body 102, and a lid assembly 106 coupled to the chamber body 102 and enclosing the substrate support 104 in a processing volume 120. A substrate 302 is provided to the processing volume 120 through an opening 126, which may be conventionally sealed for processing using a door. The substrate support 104 may be rotatable, as indicated by the arrow 145, along an axis 147, where a shaft 144 of the substrate support 104 is located. Alternatively, the substrate support 104 may be lifted up to rotate as necessary during a deposition process.

A plasma profile modulator 111 may be disposed in the processing chamber 100 to control plasma distribution across the substrate 302 disposed on the substrate support 104. The plasma profile modulator 111 includes a first electrode 108 that may be disposed adjacent to the chamber body 102 and separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode. The first electrode 108 may also be a plate electrode, for example a secondary gas distributor.

One or more isolators 110a, 110b (collectively 110), which may be a dielectric material such as a ceramic or metal oxide, for example aluminum oxide and/or aluminum nitride, contacts the first electrode 108 and separates the first electrode 108 electrically and thermally from a gas distributor 112 and from the chamber body 102. The gas distributor 112 features openings 118 for admitting process gases into the processing volume 120. The gas distributor 112 may be coupled to a first source of electric power (first electric power source) 142, such as an RF generator, RF power source, DC power, pulsed DC power, and pulsed RF power may also be used. In one implementation, the first source of electric power 142 is an RF power source.

The gas distributor 112 may be a conductive gas distributor or a non-conductive gas distributor. The gas distributor 112 may also be made of conductive and non-conductive components. For example, a body of the gas distributor 112 may be conductive while a face plate of the gas distributor 112 is non-conductive. The gas distributor 112 may be powered, such as by the first source of electric power 142 as shown in FIG. 1 or the gas distributor 112 may be coupled to ground.

The first electrode 108 may be coupled to a first tuning circuit 128 that controls a ground pathway of the processing chamber 100. The first tuning circuit 128 comprises a first electronic sensor 130 and a first electronic controller 134. The first electronic controller 134 may be or include a variable capacitor or other circuit element(s). The first tuning circuit 128 may be or include one or more inductors 132. The first tuning circuit 128 may be any circuit that enables variable or controllable impedance under the plasma conditions present in the processing volume 120 during processing. In the implementation of FIG. 1, the first tuning circuit 128 features a first circuit leg and a second circuit leg coupled in parallel between ground and the first electronic sensor 130. The first circuit leg includes a first inductor 132A. The second circuit leg includes a second inductor 132B coupled in series with the first electronic controller 134. The second inductor 132B disposed between the first electronic controller 134 and the node connecting both the first and second circuit legs to the first electronic sensor 130. The first electronic sensor 130 may be a voltage or current sensor and may be coupled to the first electronic controller 134 to afford a degree of closed-loop control of plasma conditions inside the processing volume 120.

A second electrode 122 may be coupled to the substrate support 104. The second electrode 122 may be embedded within the substrate support 104 or coupled to a surface of the substrate support 104. The second electrode 122 may be a plate, a perforated plate, a mesh, a wire screen, or any other distributed arrangement of conductive elements. The second electrode 122 may be a tuning electrode, and may be coupled to a second tuning circuit 136 by a conduit 146, for example a cable having a selected resistance, such as 50 ohms (Ω), disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled to the second electronic controller 140 to provide further control over plasma conditions in the processing volume 120.

A third electrode 124, which may be a bias electrode and/or an electrostatic chucking electrode, may be coupled to the substrate support 104. The third electrode may be coupled to a second source of electric power (second electric power source) 150 through a filter 148, which may be an impedance matching circuit. The second source of electric power 150 may be DC power, pulsed DC power, RF bias power, pulsed RF source or bias power, or a combination thereof. In one implementation, the second source of electric power 150 is a RF bias power.

The lid assembly 106 and substrate support 104 of FIG. 1 may be used with any processing chamber for plasma or thermal processing. One example of a plasma processing chamber with which the lid assembly 106 and substrate support 104 may be beneficially used is the PRODUCER® or PRECISION® platform and chambers available from Applied Materials, Inc., located in Santa Clara, Calif. Chambers from other manufacturers may also be used with the components described above.

In operation, the processing chamber 100 affords real-time control of plasma conditions in the processing volume 120. The substrate 302 is disposed on the substrate support 104, and process gases are flowed through the lid assembly 106 using an inlet 114 according to any desired flow plan. Gases exit the processing chamber 100 through an outlet 152. Electric power is coupled to the gas distributor 112 to establish a plasma in the processing volume 120. The substrate may be subjected to an electrical bias using the third electrode 124, if desired.

Upon energizing a plasma in the processing volume 120, a potential difference is established between the plasma and the first electrode 108. A potential difference is also established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In implementation where the electronic controllers are both variable capacitors, the electronic sensors may adjust the variable capacitors to maximize deposition rate and minimize thickness non-uniformity independently.

Each of the tuning circuits 128, 136 has a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, are chosen to provide an impedance range, depending on the frequency and voltage characteristics of the plasma that has a minimum in the capacitance range of each variable capacitor. Thus, when the capacitance of the first electronic controller 134 is at a minimum or maximum, impedance of the first tuning circuit 128 is high, resulting in a plasma shape that has a minimum aerial (lateral) coverage over the substrate support. When the capacitance of the first electronic controller 134 approaches a value that minimizes the impedance of the first tuning circuit 128, the aerial coverage of the plasma grows to a maximum, effectively covering the entire working area of the substrate support 104. As the capacitance of the first electronic controller 134 deviates from the minimum impedance setting, the plasma shape shrinks from the chamber walls and aerial coverage of the substrate support declines. The second electronic controller 140 has a similar effect, increasing and decreasing aerial coverage of the plasma over the substrate support as the capacitance of the second electronic controller 140 is changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. In this way, a plasma shape can be selected and dynamically controlled during processing. It should be noted that, while the foregoing discussion is based on electronic controllers 134, 140 that are variable capacitors, any electronic component with adjustable characteristic may be used to provide tuning circuits 128 and 136 with adjustable impedance.

Figure 2A:
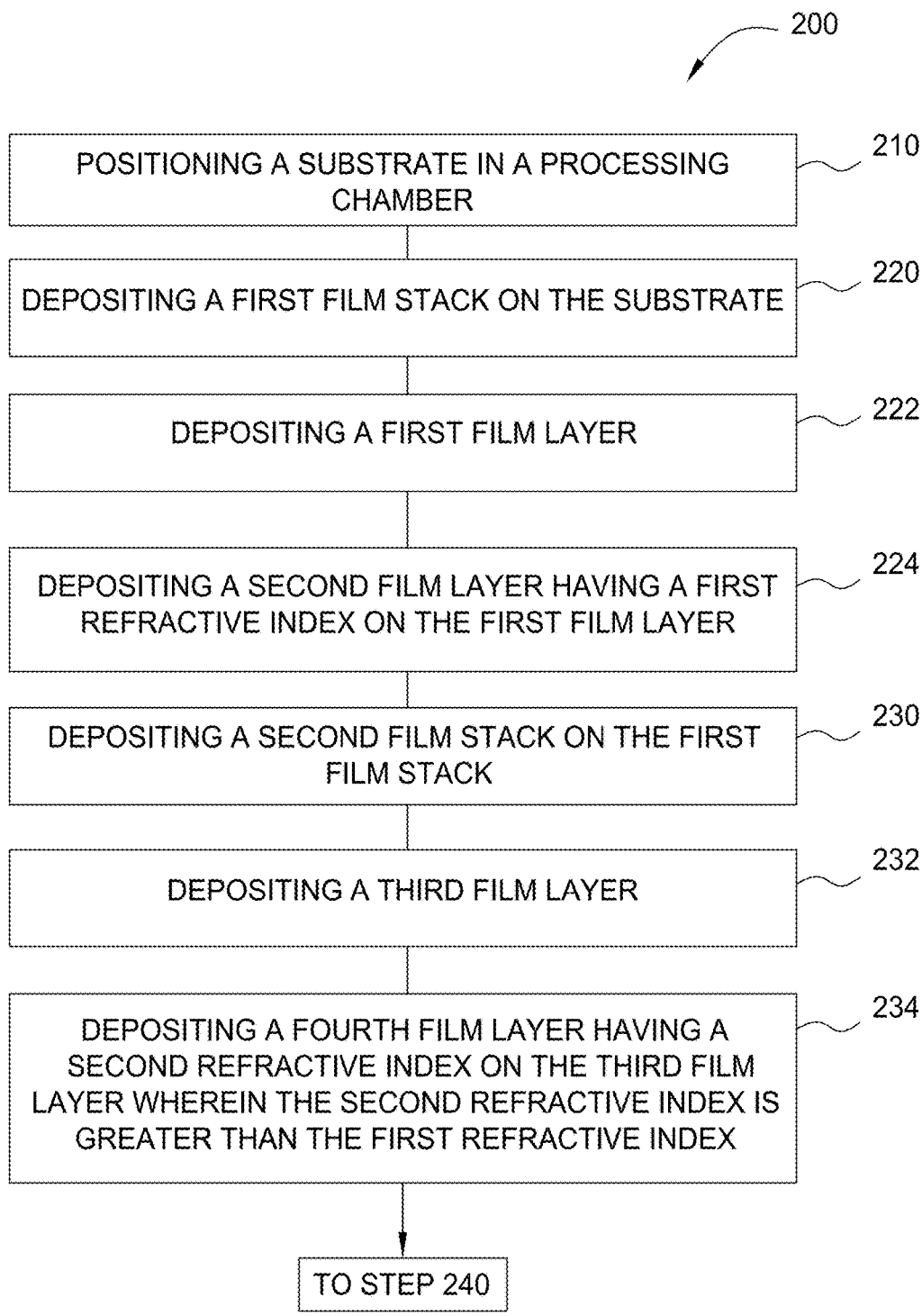
FIGS. 2A-2B depict a flow diagram of a method of forming high aspect ratio feature definitions in thin films according to implementations described herein.
Figure 2B:
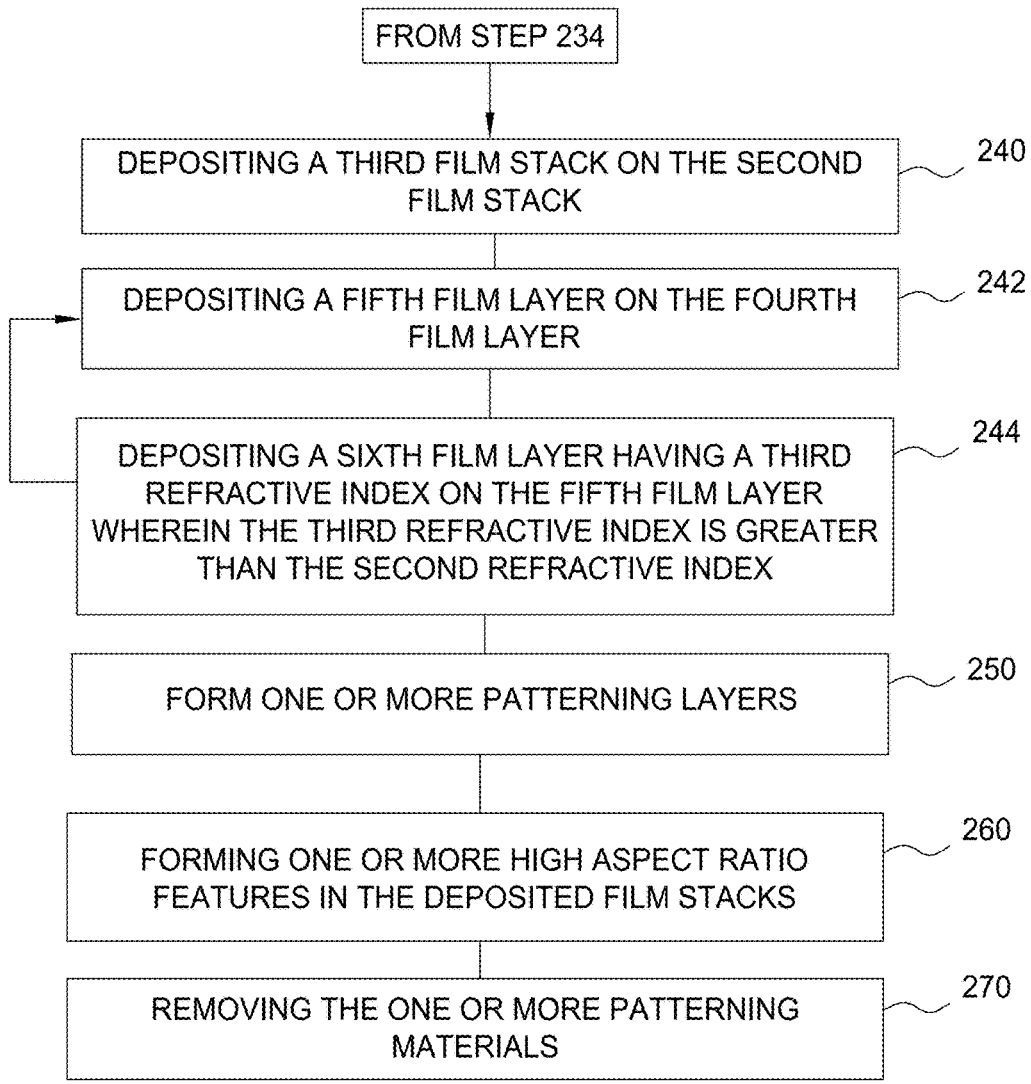

FIGS. 2A-2B depict a flow diagram of a method 200 of forming high aspect ratio feature definitions in thin films according to implementations described herein. High aspect ratio feature definitions include features with high height to width aspect ratios (the ratio of the height of the bare hole divided by the width of the hole) of at least about 5:1 or more (e.g., an aspect ratio of 6:1 or more, 7:1 or more, 8:1 or more, 9:1 or more, 10:1 or more, 11:1 or more, 12:1 or more, 16:7 or more, or even about 10:1 to about 20:1). Exemplary feature definitions which may be formed using the implementations described herein include vias, trenches, lines, contact holes, through-holes or other feature definitions utilized in a semiconductor, solar, or other electronic devices, such as high ratio contact plugs.

Figure 3A:
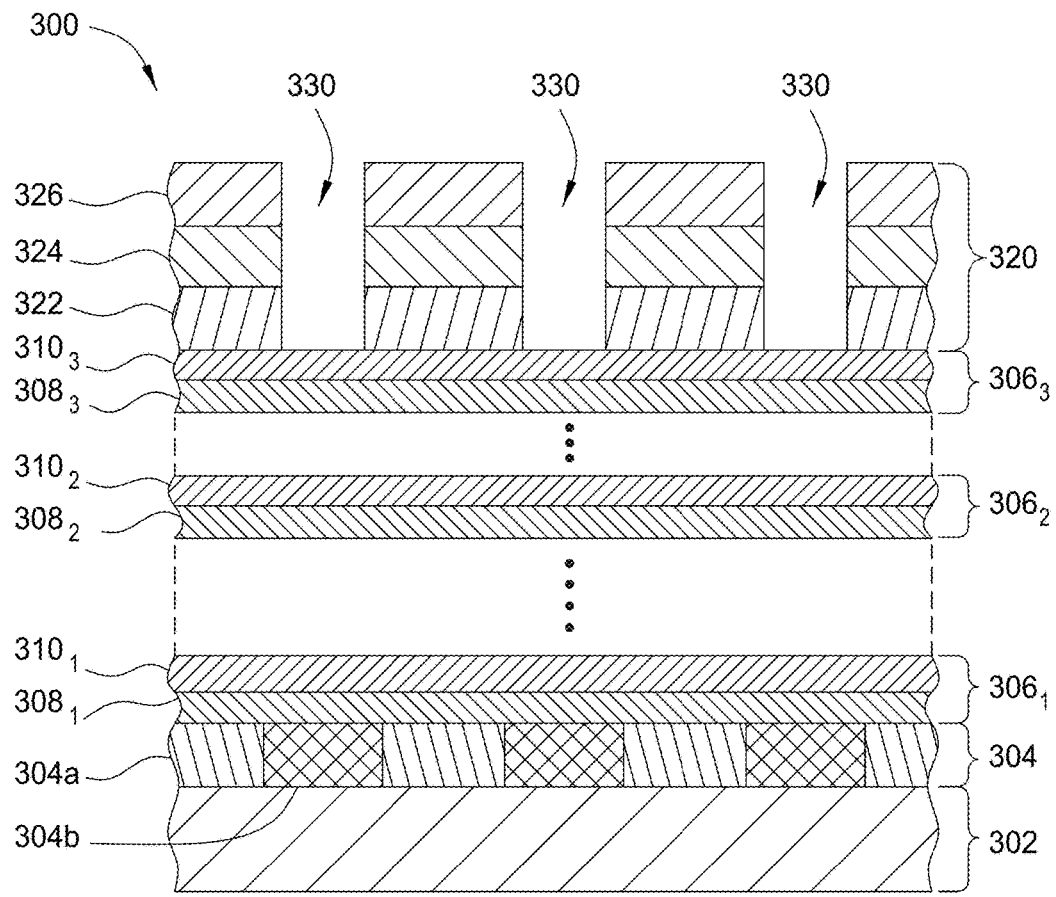
FIGS. 3A-3C depict cross-sectional views of a film structure formed on a substrate utilizing the method depicted in FIG. 2.
Figure 3B:
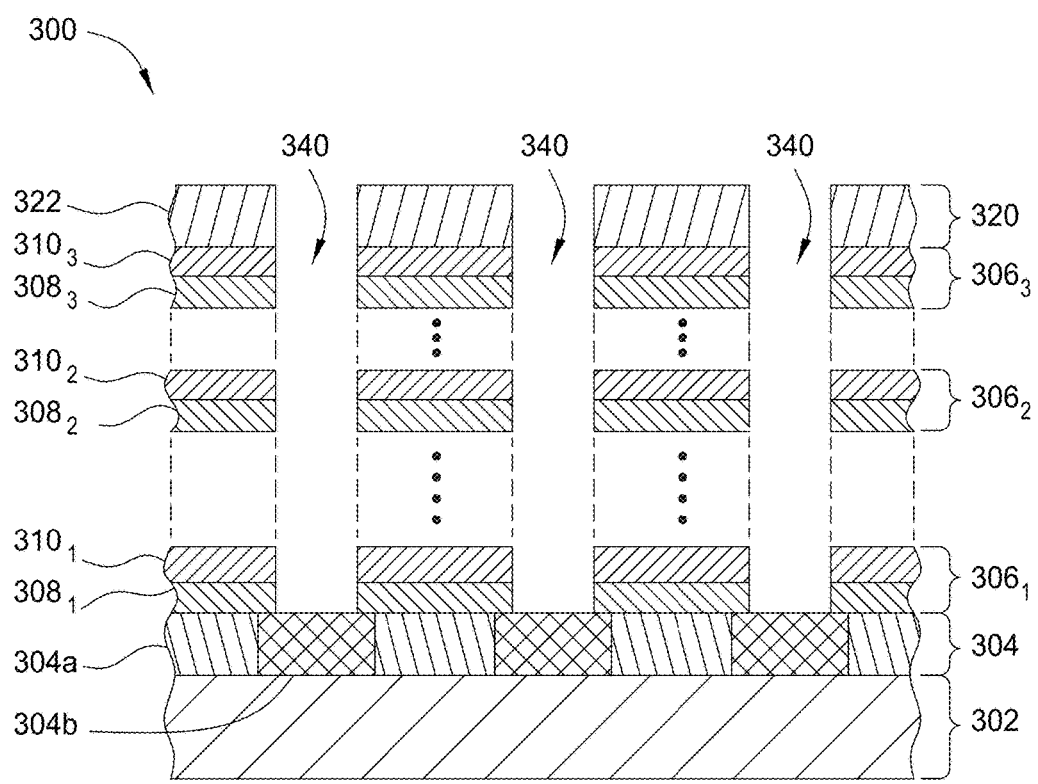
Figure 3C:
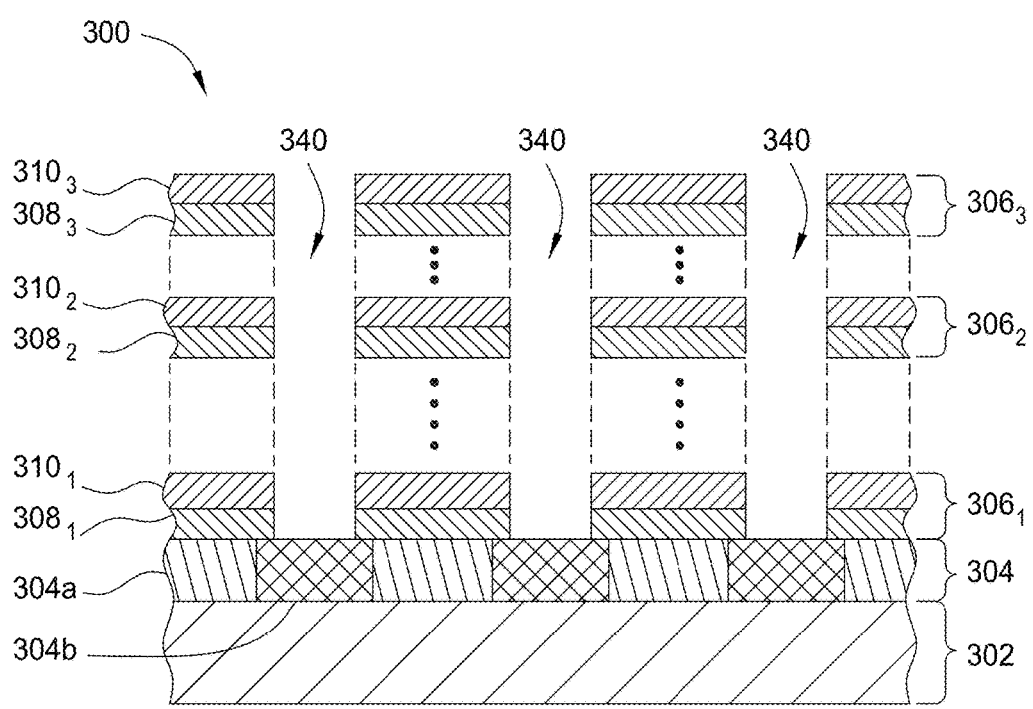

FIGS. 3A-3C depict cross-sectional view of a film structure 300 having high aspect ratios features formed therein on the substrate 302 utilizing the method depicted in FIGS. 2A-2B. In one implementation, the film structure 300 may be utilized to form gate structures for three dimensional (3D) NAND semiconductor applications. In manufacturing three dimensional (3D) NAND semiconductor applications, stair-like oxide-nitride pairs of structures are often utilized to high aspect ratio gate stack NAND cells so as to increase circuit density.

The film structure 300 may be formed on an optional base layer 304 of a substrate 302. The optional base layer 304 may be a patterned layer including a first material 304a and a second material 304b. The film structure 300 has a plurality of material layer stacks $306_1$, $306_2$, $306_3$ ... $306_n$ (collectively 306) formed on the optional base layer 304 sequentially. Each material layer stack 306 may include a first film layer $308_1$, $308_2$, $308_3$ ... $308_n$ (collectively 308) and a second film layer $310_1$, $310_2$, $310_3$ ... $310_n$ (collectively 310) formed thereon so that the film structure 300 includes a plurality of first film layers 308 and second film layers 310 formed in alternation. Various film properties of the films (e.g., refractive index, stress of the film, dopant concentration in the film) may be graded throughout the film structure 300 in order to achieve a more uniform etch profile by compensating for variations in both dry and wet etch rates as feature depth increases. In one implementation the plurality of first film layers 308 are silicon oxide layers and the plurality of second film layers 310 are silicon nitride layers. The plurality of material layer stacks 306 may be formed by PECVD deposition techniques in one processing chamber, such as the processing chamber 100.

In further implementations, the first material layer/second material layer stacks can be oxide/silicon, silicon/doped silicon, or silicon/nitride. All of these combinations of materials can be used in Bit-Cost Scalable (BiCS), Terabit Cell Array Transistor (TCAT) and other 3D memory structures. In other implementations, the first material layer/ second material layer stacks can be other combinations of materials. The deposition order of the first film layers 308 and the second film layers 310 on the substrate 302 can also be reversed.

The number of layers can depend upon the memory device being fabricated. In one embodiment, the stack numbers could be 8×, or 16×, or 24×, or even higher, where each stack of 8, 16, 24, 32, 64, 128 or more layers corresponds to one memory device. The two layers of different materials form each stack, so the corresponding number of layers for an 8× stack number can be 16, a 16× stack number can have 32 layers, a 24× stack number can have 48 layers, and a higher stack number can have a respectively higher number of layers.

The method 200 begins at operation 210 where a substrate, such as the substrate 302 depicted in FIG. 3A, is positioned into a processing chamber, such as the processing chamber 100 depicted in FIG. 1, or other suitable processing chamber. The substrate 302 shown in FIG. 3A includes the optional base layer 304 formed on the substrate 302. In implementations where the optional base layer 304 is not present, the film structure 300 may be formed directly on the surface of the substrate 302. In one implementation, the substrate 302 may have a substantially planar surface, an uneven surface, or a substantially planar surface having a structure formed thereon. The substrate 302 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 302 may have various dimensions, such as 200 mm or 300 mm diameter wafers, as well as, rectangular or square panels. Unless otherwise noted, implementations and examples described herein are conducted on substrates having a 200 mm diameter, a 300 mm diameter, or a 450 mm diameter. In one implementation, the substrate 302 may be a crystalline silicon substrate.

At operation 220, a first material layer stack $306_1$ is formed on the substrate 302. The first material layer stack $306_1$ includes the first film layer $308_1$ and the second film layer $310_1$ formed on the first film layer $308_1$. The second film layer $310_1$ has a first refractive index. It should be understood that although in the present implementation refractive index of various film layers is varied throughout the film structure, the implementations described herein are also applicable to varying other film properties (e.g., film stress, dopant concentration) within the film structure 300.

At operation 222, the first film layer $308_1$ is formed on the substrate 302. The first film layer $308_1$ may be a silicon oxide-containing layer, a silicon nitride-containing layer, a silicon-containing layer, such as amorphous silicon, polycrystalline silicon or any suitable crystalline silicon layers. In the implementation depicted in FIG. 3A, the first material layer stack $306_1$ is a silicon oxide-containing layer, such as a silicon oxide layer.

During operation 222, a deposition gas mixture is provided into the processing chamber. The deposition gas mixture may include a silicon-containing gas and a reacting gas. Suitable examples of the silicon-containing gas include, but are not limited to, silane ($SiH_4$), disilane ($Si_2H_6$), silicon tetrafluoride ($SiF_4$), silicon tetrachloride ($SiCl_4$), dichlorosilane ($SiH_2Cl_2$), tetraethyl orthosilicate (TEOS), and the like.

The reacting gas may be an oxygen-containing gas, for forming a silicon oxide-containing layer, a nitrogen-containing gas, for forming a silicon nitride containing layer, or a carbon containing gas, for forming a silicon carbide containing layer. Suitable examples of the oxygen-containing gas include $O_2$, $N_2O$, $NO_2$, $O_3$, $H_2O$ and the like. Suitable examples of the nitrogen-containing gas include $N_2$, $N_2O$, $NO_2$, $NH_3$, $N_2H_2$ and the like. Suitable examples of the carbon containing gas include $CO_2$, CO, $CH_4$, $CF_4$, other suitable carbon based polymer gases and the like.

In one implementation depicted herein, the silicon-containing gas is TEOS and the reacting gas is an oxygen-containing gas such as $N_2O$ to form the first film layer $308_1$, such as a silicon oxide-containing layer, depicted in FIG. 3A.

In one implementation, the gas ratio of the silicon-containing gas, such as the TEOS gas, and reacting gas, such as the oxygen-containing gas ($O_2$, $N_2O$, $NO_2$, $O_3$, and $H_2O$) is maintained to control reaction behavior of the gas mixture, thus allowing a desired proportion of the oxygen elements in the formed silicon film. In one implementation, the silicon-containing gas (e.g., TEOS gas) may be supplied at a flow rate between about 500 mgm and about 3500 mgm (e.g., between about 500 mgm and about 1000 mgm; between about 1100 mgm and about 2000 mgm; between about 2100 mgm and about 3500 mgm) for a 300 mm substrate and the oxygen-containing gas (e.g., $N_2O$) may be supplied at a flow rate at between about 500 sccm and about 9000 sccm (e.g., between about 500 sccm and about 2500 sccm; between about 3000 sccm and about 6000 sccm; between about 6500 sccm and about 9500 sccm) for a 300 mm substrate. The gas mixture of TEOS gas and $N_2O$ gas may be supplied at a ratio of TEOS to $N_2O$ of between about 1:1 and about 1:150, such as between about 1:1 and about 1:120, for example, about 1:100.

Alternatively, one or more inert gases may be included in the deposition gas mixture provided to the processing chamber 100. The inert gas may include, but not limited to, noble gas, such as Ar, He, and Xe, or $N_2$ and the like. The inert gas may be supplied to the processing chamber 100 at a flow rate at between about 0 sccm and about 5000 sccm (between about 100 sccm and about 1500 sccm; between about 2000 sccm and about 4000 sccm) for a 300 mm substrate. The inert gas may be supplied to the processing chamber 100 at a flow ratio of inert gas to TEOS gas of between about 1:1 and about 1:150. In some implementations, the flow of inert gas may be commenced prior to supplying the flow of the deposition gas into the process chamber.

In one implementation described herein, the silicon-containing gas is TEOS, the reacting gas is an oxygen-containing gas such as $N_2O$ and the inert gas is argon to form the first film layer $308_1$, such as a silicon oxide-containing layer, depicted in FIG. 3A.

Several process parameters are regulated while the deposition gas mixture is supplied into the processing chamber. In one implementation, a pressure of the process gas mixture in the deposition processing chamber is regulated between about 10 mTorr to about 15 Torr, and the substrate temperature is maintained between about 200 degrees Celsius and about 700 degrees Celsius.

During operation 222, while supplying the deposition gas mixture into the processing chamber, an RF source power may be generated by the first source of electric power 142 (depicted in FIG. 1) and coupled to the gas mixture to assist dissociating the deposition gas mixture into reactive species in a plasma. In some implementations, the RF source power may be generated prior to supplying the deposition gas into the process chamber.

The RF source and/or bias power energizes the deposition gas mixture within the processing volume 120 such that the plasma may be sustained. In one implementation, the first source of electric power 142 may be operated to provide RF power at a frequency between 0.3 MHz and about 14 MHz, such as about 13.56 MHz. The first source of electric power 142 may generate RF power at about 10 Watts to about 5000 Watts, (e.g., between about 300 Watts to about 1500 Watts; between about 500 Watts). In some implementations, in addition to the RF source power, the RF bias power provided by the second source of electric power 150 (depicted in FIG. 1) may also be utilized during the deposition process to assist dissociating the deposition gas mixture forming the plasma. In one implementation, the first source of electric power 142 may be operated to provide RF power at a frequency between 0.3 MHz and about 14 MHz, such as about 13.56 MHz. The RF bias power may be supplied at between about 0 Watts and about 1000 Watts (e.g., between about 10 Watts and about 100 Watts) at a frequency of 300 kHz. In one implementation, the RF bias power may be pulsed with a duty cycle between about 10 to about 95 percent at a RF frequency between about 500 Hz and about 10 kHz.

Furthermore, current/voltage may be supplied to the plasma profile modulator 111 to assist controlling profile and distribution of the plasma across the substrate 302. In one implementation, the side wall tuning electrode current target (e.g., supplied to the first electrode 108) is set to between about 0.5 Amperes and about 40 Amperes, such as about 6 Amperes, and substrate support tuning electrode current target (e.g., supplied to the second electrode 122) is set to between about 0.5 Amperes and about 40 Amperes, such as about 6 Amperes, to assist controlling the plasma as generated in the processing volume 120.

In some implementations during operation 222, a combination of high frequency RF between about 300 Watts to about 1500 Watts and low frequency RF between about 0 Watts to about 1000 Watts may be applied during the deposition process.

After a desired thickness of the first film layer $308_1$ is deposited, the deposition process may then be terminated. In one implementation, the first film layer $308_1$ may have a thickness between about 10 nm and about 60 nm, such as about 30 nm. In the implementation wherein the first film layer $308_1$ is a silicon oxide-containing layer, such as a silicon oxide layer, the silicon oxide-containing layer may have a stress range between about 0 MPa and about +1000 MPa.

An optional pump/purge process to pump/purge the residual gases or deposition by-products from the processing chamber may be performed prior to forming the second film layer $310_1$ on the first film layer $308_1$. In some implementations where an inert gas is used during operation 222, the inert gas may be used as the purge gas with or without the application of RF power.

At operation 224, the second film layer $310_1$ is formed on the first film layer $308_1$. The second film layer $310_1$ may be a silicon oxide-containing layer, a silicon nitride-containing layer, a silicon-containing layer, such as amorphous silicon, polycrystalline silicon or any suitable crystalline silicon layers. In the implementation depicted in FIG. 3A, the second film layer $310_1$ is a silicon nitride containing layer, such as a silicon nitride layer.

During operation 224, a deposition gas mixture is provided into the processing chamber. The deposition gas mixture may include a silicon-containing gas and a reacting gas. Suitable examples of the silicon-containing gas include, but not limited to, silane ($SiH_4$), disilane ($Si_2H_6$), silicon tetrafluoride ($SiF_4$), silicon tetrachloride ($SiCl_4$), dichlorosilane ($SiH_2Cl_2$), tetraethyl orthosilicate (TEOS), and the like.

The reacting gas may be an oxygen-containing gas, for forming a silicon oxide-containing layer, a nitrogen-containing gas, for forming a silicon nitride containing layer, or a carbon containing gas, for forming a silicon carbide containing layer. Suitable examples of the oxygen-containing gas include $O_2$, $N_2O$, $NO_2$, $O_3$, $H_2O$ and the like. Suitable examples of the nitrogen-containing gas include $N_2$, $N_2O$, $NO_2$, $NH_3$, $N_2H_2$ and the like. Suitable examples of the carbon containing gas include $CO_2$, CO, $CH_4$, $CF_4$, other suitable carbon based polymer gases and the like.

In one implementation depicted herein, the silicon-containing gas is $SiH_4$ and the reacting gas is a nitrogen-containing gas such as $NH_3$ and $N_2$ to form the second film layer $310_1$, such as a silicon nitride containing layer, as depicted in FIG. 3A.

In one implementation, the gas ratio of the silicon-containing gas, such as the $SiH_4$ gas, and reacting gas, such as the nitrogen-containing gas ($N_2$, $N_2O$ or $NH_3$) is maintained to control reaction behavior of the gas mixture, thus allowing a desired proportion of the nitrogen elements in the formed silicon film. In one implementation, the silicon-containing gas (e.g., $SiH_4$ gas) may be supplied at a flow rate between about 30 sccm and about 400 sccm (e.g., between about 30 sccm and about 100 sccm; between about 150 sccm and about 300 sccm) for a 300 mm substrate and the nitrogen-containing gas (e.g., $NH_3$) may be supplied at a flow rate at between about 200 sccm and about 9000 sccm (e.g., between about 200 sccm and about 7000 sccm; between about 500 sccm and about 2500 sccm; between about 3000 sccm and about 6000 sccm; between about 6500 sccm and about 9500 sccm) for a 300 mm substrate. The gas mixture of $SiH_4$ gas and $NH_3$ gas may be supplied at a ratio of $SiH_4$ to $NH_3$ of between about 1:1 and about 1:150, such as between about 1:1 and about 1:120, for example, about 1:100.

Alternatively, one or more inert gases may be included in the deposition gas mixture provided to the processing chamber 100. The inert gas may include, but not limited to, noble gas, such as Ar, He, and Xe, or $N_2$ and the like. The inert gas may be supplied to the processing chamber 100 at a flow rate at between about 0 sccm and about 5000 sccm (between about 100 sccm and about 1500 sccm; between about 2000 sccm and about 4000 sccm) for a 300 mm substrate. The inert gas may be supplied to the processing chamber 100 at a flow ratio of inert gas to TEOS gas of between about 1:1 and about 1:150. In some implementations, the flow of inert gas may be commenced prior to supplying the flow of the deposition gas into the process chamber.

In one implementation described herein, the silicon-containing gas is $SiH_4$, the reacting gas is a nitrogen-containing gas such as $NH_3$ and $N_2$ and the inert gas is argon to form the second film layer $310_1$, such as a silicon oxide-containing layer, depicted in FIG. 3A.

Several process parameters are regulated while the deposition gas mixture is supplied into the processing chamber. In one implementation, a pressure of the process gas mixture in the deposition processing chamber is regulated between about 10 mTorr to about 15 Torr, and the substrate temperature is maintained between about 200 degrees Celsius and about 700 degrees Celsius.

During operation 222, while supplying the deposition gas mixture into the processing chamber, an RF source power may be generated by the first source of electric power 142 (depicted in FIG. 1) and coupled to the gas mixture to assist dissociating the deposition gas mixture into reactive species in a plasma.

The RF source and/or bias power energizes the deposition gas mixture within the processing volume 120 such that the plasma may be sustained. In one implementation, the first source of electric power 142 may be operated to provide RF power at a frequency between 0.3 MHz and about 14 MHz, such as about 13.56 MHz. The first source of electric power 142 may generate RF power at about 10 Watts to about 5000 Watts (e.g., between about 300 Watts to about 1500 Watts; about 500 Watts). In some implementations, in addition to the RF source power, the RF bias power provided by the second source of electric power 150 (depicted in FIG. 1) may also be utilized during the deposition process to assist dissociating the deposition gas mixture forming the plasma. In one implementation, the first source of electric power 142 may be operated to provide RF power at a frequency between 0.3 MHz and about 14 MHz, such as about 13.56 MHz. The RF bias power may be supplied at between about 0 Watts and about 1000 Watts (e.g., between about 10 Watts and about 100 Watts) at a frequency of 300 kHz. In one implementation, the RF bias power may be pulsed with a duty cycle between about 10 to about 95 percent at a RF frequency between about 500 Hz and about 10 kHz.

Furthermore, current/voltage may be supplied to the plasma profile modulator 111 to assist controlling profile and distribution of the plasma across the substrate 302. In one implementation, the side wall tuning electrode current target (e.g., supplied to the first electrode 108) is set to between about 0.5 Amperes and about 40 Amperes, such as about 6 Amperes, and substrate support tuning electrode current target (e.g., supplied to the second electrode 122) is set to between about 0.5 Amperes and about 40 Amperes, such as about 6 Amperes, to assist controlling the plasma as generated in the processing volume 120.

After a desired thickness of the second film layer $310_1$ is deposited, the deposition process may then be terminated. In one implementation, the second film layer $310_1$ may have a thickness between about 10 nm and about 60 nm, such as about 30 nm. In the implementation wherein the second film layer $310_1$ is a silicon nitride containing layer, such as a silicon nitride layer, the silicon nitride containing layer may have a stress range between about 0 MPa and about 1000 MPa. The second film layer $310_1$ has a refractive index from about 1.85 to about 2.1 (e.g., a refractive index of about 1.85 to about 1.90; a refractive index of about 1.90).

An optional pump/purge process to pump/purge the residual gases or deposition by-products from the processing chamber after forming the second film layer $310_1$. In some implementations where an inert gas is used during operation 224, the inert gas may be used as the purge gas with or without the application of RF power.

Operations 222 and 224 of FIG. 2 may be continuously performed to form the material layer stack $306_1$ with alternating first film layers $308_1$ and second film layers $310_1$ until a desired thickness of the first material layer stack $306_1$ is achieved. In one implementation, where the first film layer $308_1$ is a silicon oxide layer and the second film layer $310_1$ is a silicon nitride layer, the method 200 of FIG. 2 may be performed by switching different deposition gas mixtures to form the film layers $308_1$, $310_1$ with different compositions without removing the substrate 302 from the processing chamber 100 (e.g., without breaking vacuum).

For example, the film material layer stack $306_1$ may be formed by first supplying a first deposition gas mixture with a first set of process parameters (regulated at operation 222) to form the first film layer $308_1$, such as a silicon oxide layer. The first deposition gas mixture may include at least a silicon-containing gas and an oxygen-containing gas. After the thickness of the first film layer $308_1$ is reached, the first deposition gas mixture may be switched to a second deposition gas mixture with a second set of process parameters the second film layer $310_1$, such as a silicon nitride layer. The second deposition gas mixture may include at least a silicon-containing gas and a nitrogen-containing gas. Switch between the first and the second deposition gas mixtures may optionally have a pump/purge process to pump/purge the residual gases or deposit byproducts from the processing chamber prior to forming a next film layer on the substrate 302.

At operation 230, after deposition of the first material layer stack $306_1$ on the substrate, a second material layer stack $306_2$ is formed on the first material layer stack $306_1$. The second material layer stack $306_2$ includes a third film layer $308_2$ and a fourth film layer $310_2$ formed on the third film layer $308_2$. The fourth film layer $310_2$ has a second refractive index that is greater than the first refractive index of the second film layer $310_1$.

At operation 232, the third film layer $308_2$ is formed over the first material layer stack $306_1$. The third film layer $308_2$ may be a silicon oxide-containing layer, a silicon nitride-containing layer, a silicon-containing layer, such as amorphous silicon, polycrystalline silicon or any suitable crystalline silicon layers. In the implementation depicted in FIG. 3A, the third film layer $308_2$ is a silicon oxide-containing layer, such as a silicon oxide layer. The third film layer $308_2$ may be similar to the first film layer $308_1$ and may be formed using the process conditions described in operation 222.

An optional pump/purge process to pump/purge the residual gases or deposition by-products from the processing chamber may be performed prior to forming the fourth film layer $310_2$ on the third film layer $308_2$. In some implementations where an inert gas is used during operation 232, the inert gas may be used as the purge gas with or without the application of RF power.

At operation 234, a fourth film layer $310_2$ is formed on the third film layer $308_2$. The fourth film layer $310_2$ may be a silicon oxide-containing layer, a silicon nitride-containing layer, a silicon-containing layer, such as amorphous silicon, polycrystalline silicon or any suitable crystalline silicon layers. In the implementation depicted in FIG. 3A, the fourth film layer $310_2$ is a silicon nitride containing layer, such as a silicon nitride layer. The fourth film layer $310_2$ has a refractive index that is greater than the refractive index of the second film layer $310_1$. The fourth film layer $310_2$ may be deposited using process conditions similar to the process conditions described for operation 224. However, in order to achieve a refractive index greater than the refractive index of the second film layer $310_1$ various process parameters are varied relative to the process parameters described in operation 224.

In some implementations either the flow rate of the silicon-containing gas (e.g., $SiH_4$) or the flow rate of the nitrogen-containing gas (e.g., $NH_3$) is varied relative to the flow rates described in operation 224 in order to achieve the greater refractive index of the fourth film layer $310_2$ relative to the second film layer $310_1$. Other process conditions such as chamber pressure and/or spacing between the substrate 302 and the gas distributor 112 may be adjusted in order to achieve the increased refractive index. For example, in one implementation, the flow rate of the silicon-containing gas (e.g., $SiH_4$) is increased relative to the flow rate of the silicon-containing gas (e.g., $SiH_4$) used for forming the second film layer $310_1$ described in operation 224. In another implementation, the flow rate of the nitrogen-containing gas (e.g., $NH_3$) is increased relative to the flow rate of the nitrogen-containing gas (e.g., $NH_3$) used for forming the second film layer $310_1$ described in operation 224.

After a desired thickness of the fourth film layer $310_2$ is deposited, the deposition process may then be terminated. In one implementation, the fourth film layer $310_2$ may have a thickness between about 10 nm and about 60 nm, such as about 30 nm. In the implementation wherein the fourth film layer $310_2$ is a silicon nitride containing layer, such as a silicon nitride layer, the silicon nitride containing layer may have a stress range between about 0 MPa and about 1000 MPa. The fourth film layer $310_2$ has a refractive index from about 1.85 to about 2.1 (e.g., a refractive index of about 1.91 to about 1.95; a refractive index of about 1.93).

An optional pump/purge process to pump/purge the residual gases or deposition by-products from the processing chamber after forming the fourth film layer $310_2$. In some implementations where an inert gas is used during operation 234, the inert gas may be used as the purge gas with or without the application of RF power.

Operations 232 and 234 of FIG. 2 may be continuously performed to form the second material layer stack $306_2$ with alternating third film layers $308_2$ and fourth film layers $310_2$ until a desired thickness of the second material layer stack $306_2$ is achieved. In one implementation, where the third film layer $308_2$ is a silicon oxide layer and the fourth film layer $310_2$ is a silicon nitride layer, the method 200 of FIG. 2 may be performed by switching different deposition gas mixtures to form the film layers $308_2$, $310_2$ with different compositions without removing the substrate 302 from the processing chamber 100 (e.g., without breaking vacuum).

At operation 240, after deposition of the second material layer stack $306_2$ on the substrate, a third material layer stack $306_3$ is formed on the second material layer stack $306_2$. The third material layer stack $306_3$ includes a fifth film layer $308_3$ and a sixth film layer $310_3$ formed on the fifth film layer $308_3$. The sixth film layer $310_3$ has a third refractive index that is greater than the second refractive index of the fourth film layer $310_2$.

At operation 242, the fifth film layer $308_3$ is formed over the second material layer stack $306_2$. The fifth film layer $308_3$ may be a silicon oxide-containing layer, a silicon nitride-containing layer, a silicon-containing layer, such as amorphous silicon, polycrystalline silicon or any suitable crystalline silicon layers. In the implementation depicted in FIG. 3A, the fifth film layer $308_3$ is a silicon oxide-containing layer, such as a silicon oxide layer. The fifth film layer $308_3$ may be similar to the first film layer $308_1$ and the third film layer $308_2$ and may be formed using the process conditions described in operations 222 and 232.

An optional pump/purge process to pump/purge the residual gases or deposition by-products from the processing chamber may be performed prior to forming the sixth film layer $310_3$ on the fifth film layer $308_3$. In some implementations where an inert gas is used during operation 242, the inert gas may be used as the purge gas with or without the application of RF power.

At operation 244, the sixth film layer $310_3$ is formed on the fifth film layer $308_3$. The sixth film layer $310_3$ may be a silicon oxide-containing layer, a silicon nitride-containing layer, a silicon-containing layer, such as amorphous silicon, polycrystalline silicon or any suitable crystalline silicon layers. In the implementation depicted in FIG. 3A, the sixth film layer $310_3$ is a silicon nitride containing layer, such as a silicon nitride layer. The sixth film layer $310_3$ has a refractive index that is greater than the refractive index of the fourth film layer $310_2$. The sixth film layer $310_3$ may be deposited using process conditions similar to the process conditions described for operations 224 and 234. However, in order to achieve a refractive index greater than the refractive index of the fourth film layer $310_2$ various process parameters are varied relative to the process parameters described in operations 224 and 234. In some implementations, either the flow rate of the silicon-containing gas (e.g., $SiH_4$) or the flow rate of the nitrogen-containing gas ($NH_3$) is varied relative to the flow rates described in operation 234 in order to achieve the greater refractive index of the sixth film layer $310_3$ relative to the refractive index of the fourth film layer $310_2$. For example, in one implementation, the flow rate of the silicon-containing gas (e.g., $SiH_4$) is increased relative to the flow rate of the silicon-containing gas (e.g., $SiH_4$) used for forming the fourth film layer $310_2$ described in operation 234. In another implementation, the flow rate of the nitrogen-containing gas (e.g., $NH_3$) is increased relative to the flow rate of the nitrogen-containing gas (e.g., $NH_3$) used for forming the fourth film layer $310_2$ described in operation 234.

After a desired thickness of the sixth film layer $310_3$ is deposited, the deposition process may then be terminated. In one implementation, the sixth film layer $310_3$ may have a thickness between about 10 nm and about 60 nm, such as about 30 nm. In the implementation wherein the sixth film layer $310_3$ is a silicon nitride containing layer, such as a silicon nitride layer, the silicon nitride containing layer may have a stress range between about 0 MPa and about 1000 MPa. The sixth film layer $310_3$ has a refractive index from about 1.85 to about 2.1 (e.g., a refractive index of about 1.95 to about 2.1; a refractive index of about 1.95).

An optional pump/purge process to pump/purge the residual gases or deposition by-products from the processing chamber after forming the sixth film layer $310_3$. In some implementations where an inert gas is used during operation 244, the inert gas may be used as the purge gas with or without the application of RF power.

Operations 242 and 244 of FIG. 2B may be continuously performed to form the third material layer stack $306_3$ with alternating fifth film layers $308_3$ and sixth film layers $310_3$ until a desired thickness of the second material layer stack $306_2$ is achieved. In one implementation, where the fifth film layer $308_3$ is a silicon oxide layer and the sixth film layer $310_3$ is a silicon nitride layer, the method 200 of FIG. 2 may be performed by switching different deposition gas mixtures to form the film layers $308_3$, $310_3$ with different compositions without removing the substrate 302 from the processing chamber 100 (e.g., without breaking vacuum).

At operation 250 one or more patterning layers 320 are formed on the film structure 300. The one or more patterning layers may include, for example, a hardmask layer 322 (e.g., amorphous carbon layer), an anti-reflective coating layer 324, and a photoresist layer 326. The one or more patterning layers may be patterned using techniques known in the art to form openings 330. For example, an image of a pattern may be introduced into the photoresist layer 326 using know lithographic techniques. The image of the pattern introduced in the photoresist layer 326, may be developed in an appropriate developer to define the pattern through such layer. Thereafter, the pattern defined in the photoresist layer 326 is transferred through both the anti-reflective coating layer 324 and the hardmask layer 322. The pattern is transferred through both the anti-reflective coating layer 324 and the hardmask layer 322 using the photoresist layer 326 as a mask. The pattern may be transferred through the anti-reflective coating layer 324 using a gas mixture comprising, for example, a hydrogen-containing fluorocarbon ($C_xF_yH_z$) and one or more gases selected from the group consisting of hydrogen ($H_2$), nitrogen ($N_2$), oxygen ($O_2$), argon (Ar), and helium (He). The hardmask layer 322 can be etched using ozone, oxygen, or ammonia plasmas alone or in combination with hydrogen bromide (HBr), nitrogen ($N_2$), carbon tetrafluoride ($CF_4$), argon (Ar), among others.

At operation 260 one or more high aspect ratio features 340 are formed in the film structure 300. The openings 330 defined in the one or more patterning layers 320 may be transferred through the film structure 300 to form the one or more high aspect ratio features 340 using the hardmask layer 322. The high aspect ratio features 340 may be formed using reactive ion etching techniques or other anisotropic etching techniques. In one implementation, plasma or ion beam of etch gas may be directed to the substrate 302 to form the one or more high aspect ratio features 340. The etch gas may include $SF_6$, $C_3F_8$ $CF_4$, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $AsF_5$, $PF_3$, $PF_5$, or combinations thereof.

At operation 270, after formation of the high aspect ratio features 340 in the film structure 300, the hardmask layer 322 may be stripped from the film structure 300 by etching it in an ozone, oxygen, ammonia plasma alone or in combination with fluorinated compounds, nitrogen, or hydrogen plasmas.

Figure 4:
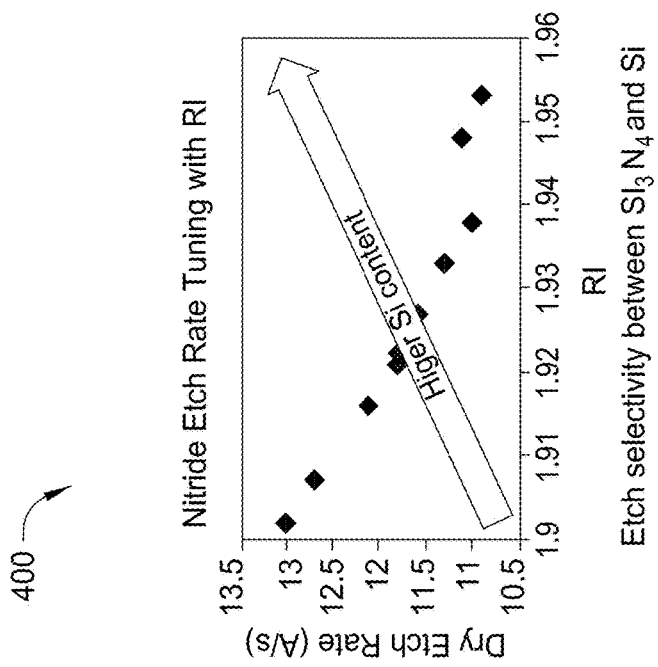
FIG. 4 is a plot depicting the dry etch rate (Å/second) for a silicon nitride material as it relates to the refractive index of the silicon nitride material.

FIG. 4 is a plot 400 depicting the dry etch rate (Å/second) for a silicon nitride material as it relates to the refractive index of the silicon nitride material. As depicted in plot 400, as the refractive index of the silicon nitride film increases, the dry etch rate decrease.

Figures 5A, 5B, 5C:
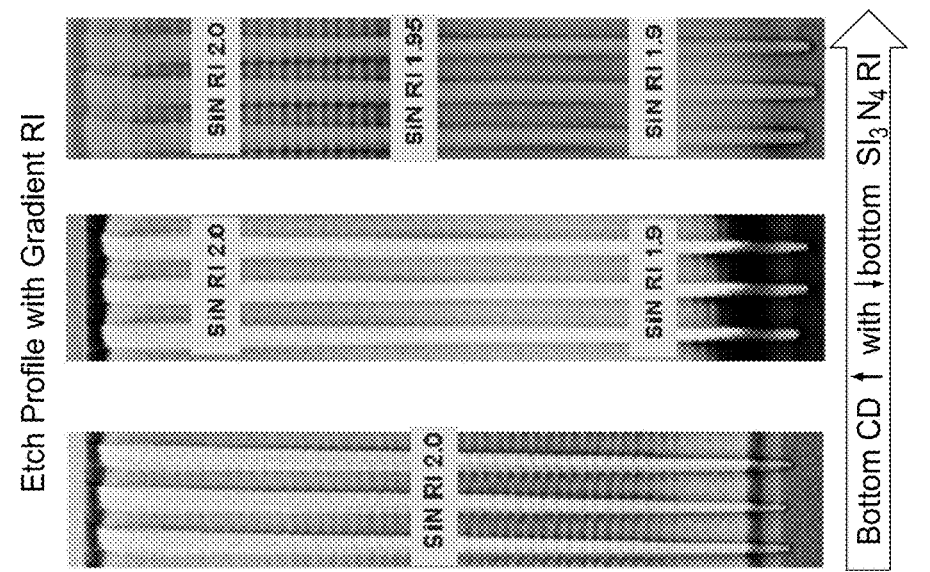
FIG. 5A is a micrograph depicting the etch profile of a trench formed in a silicon nitride containing structure with a constant refractive index according to prior art methods.
FIG. 5B is a micrograph depicting the etch profile of a trench formed in a silicon nitride containing structure having a refractive index gradient according to implementations described herein.
FIG. 5C is a micrograph depicting the etch profile of another trench formed in a silicon nitride containing structure having a refractive index gradient according to implementations described herein.

FIG. 5A is a micrograph depicting the etch profile of a trench formed in a silicon nitride containing structure without a refractive index gradient formed according to prior art methods. As depicted in FIG. 5A, the etch profile of the silicon nitride film without a refractive index is non-uniform.

FIG. 5B is a micrograph depicting the etch profile of a trench formed in a silicon nitride containing structure having a refractive index gradient according to implementations described herein. As depicted in FIG. 5B, the etch profile of the trench formed in a structure having multiple silicon nitride layers with a refractive index of 1.9 and multiple silicon nitride layers having a refractive index of 2.0 is more uniform relative to the etch profile depicted in FIG. 5A.

FIG. 5C is a micrograph depicting the etch profile of another trench formed in a silicon nitride containing structure having a refractive index gradient according to implementations described herein. As depicted in FIG. 5C, the etch profile of the trench formed in a structure having multiple silicon nitride layers with a refractive index of 1.9, multiple silicon nitride layers having a refractive index of 1.95, and multiple silicon nitride layers having a refractive index of 2.0 is more uniform relative to the etch profiles depicted in both FIGS. 5A and 5B.

As used herein, the following terms have the meaning set forth below unless otherwise stated or clear from the context of their use.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

The term "substrate" refers to a support substrate with or without layers formed thereon. The support substrate may be an insulator or semiconductor of a variety of doping concentrations and profiles and may, for example, be a semiconductor substrate of the type used in the manufacture of integrated circuits.

While the foregoing is directed to implementations of the present disclosure, other and further implementations of the disclosure may be devised without departing from the basic scope thereof, and the scope thereof is determined by the claims that follow.

The invention claimed is:

1. A method for forming a high aspect ratio feature, comprising:
   depositing one or more silicon oxide/silicon nitride containing stacks on a substrate positioned in a processing chamber and in the presence of a vacuum, wherein depositing the one or more silicon oxide/silicon nitride containing stacks comprises:
      (a) energizing a first process gas into a first plasma;
      (b) depositing a first film layer on the substrate from the first plasma;
      (c) energizing a second process gas into a second plasma;
      (d) depositing a second film layer on the first film layer from the second plasma, wherein the second film layer has a refractive index;
      repeating (a), (b), (c), and (d) until a predetermined number of first film layers and second film layers have been deposited on the substrate, wherein the first film layer is a silicon oxide layer and the second film layer is a silicon nitride layer;
      (e) energizing a third process gas into a third plasma;
      (f) depositing a third film layer on a previous layer from the third plasma;
      (g) energizing a fourth process gas into a fourth plasma;
      (h) depositing a fourth film layer on the third film layer from the fourth plasma, wherein the fourth film layer has a refractive index greater than the refractive index of the second film layer;
      repeating (e), (f), (g), and (h) until a predetermined number of third film layers and fourth film layers have been deposited, wherein the third film layer is a silicon oxide layer and the fourth film layer is a silicon nitride layer; and
   forming one or more high aspect ratio features in the one or more silicon oxide/silicon nitride containing stacks using plasma etching or wet etching techniques, wherein the high aspect ratio feature has a height to width ratio of at least about 5:1 or more.

2. The method of claim 1, wherein the first process gas comprises a silicon-containing gas and an oxygen-containing gas.

3. The method of claim 2, wherein the silicon-containing gas is tetraethyl orthosilicate (TEOS) and the oxygen-containing gas is $N_2O$.

4. The method of claim 3, wherein the second process gas comprises a silicon-containing gas and a nitrogen-containing gas.

5. The method of claim 4, wherein the silicon-containing gas is silane ($SiH_4$) and the nitrogen-containing gas is $NH_3$.

6. The method of claim 1, wherein the second process gas and the fourth process gas each comprise a nitrogen-containing gas and a flow rate of the nitrogen-containing gas in the fourth process gas is increased relative to a flow rate of the nitrogen-containing gas in the second process gas.

7. The method of claim 1, wherein the second process gas and the fourth process gas each comprise a silicon-containing gas and a flow rate of the silicon-containing gas in the fourth process gas is increased relative to a flow rate of the silicon-containing gas in the second process gas.

8. The method of claim 1, wherein the high aspect ratio feature has a height to width ratio of about 10:1 to about 20:1.

9. The method of claim 1, further comprising:
   (i) energizing a fifth process gas into a fifth plasma;
   (j) depositing a fifth film layer on a previous layer from the fifth plasma;
   (k) energizing a sixth process gas into a sixth plasma;
   (l) depositing a sixth film layer on the fifth film layer from the sixth plasma, wherein the sixth film layer has a refractive index greater than the refractive index of the fourth film layer; and
   repeating (i), (j), (k), and (l) until a predetermined number of fifth film layers and sixth film layers have been deposited on the substrate, wherein the fifth film layer is a silicon oxide layer and the sixth film layer is a silicon nitride layer.

10. The method of claim 9, wherein the refractive index of the second film layer is from about 1.85 to about 1.90, the refractive index of the fourth film layer is from about 1.91 to about 1.95, and the refractive index of the sixth film layer is from about 1.95 to about 2.1.

11. The method of claim 1, further comprising forming one or more patterning layers over the one or more silicon oxide/silicon nitride containing stacks prior to forming one or more high aspect ratio features in the one or more silicon oxide/silicon nitride containing stacks.

12. The method of claim 9, wherein the second film layer has a thickness from about 10 nanometers to about 60 nanometers, the fourth film layer has a thickness from about 10 nanometers to about 60 nanometers, and the sixth film layer has a thickness from about 10 nanometers to about 60 nanometers.

13. A method for forming a high aspect ratio feature, comprising:
   depositing one or more silicon oxide/silicon nitride containing stacks on a substrate positioned in a processing chamber and in the presence of a vacuum, wherein depositing the one or more silicon oxide/silicon nitride containing stacks comprises:
      (a) energizing a first process gas into a first plasma;
      (b) depositing a first film layer on the substrate from the first plasma;
      (c) energizing a second process gas into a second plasma;
      (d) depositing a second film layer on the first film layer from the second plasma, wherein the second film layer has a refractive index from about 1.85 to about 1.90;
      repeating (a), (b), (c), and (d) until a predetermined number of first film layers and second film layers have been deposited on the substrate, wherein the first film layer is a silicon oxide layer and the second film layer is a silicon nitride layer;
      (e) energizing a third process gas into a third plasma;
      (f) depositing a third film layer on a previous layer from the third plasma;
      (g) energizing a fourth process gas into a fourth plasma;

(h) depositing a fourth film layer on the third film layer from the fourth plasma, wherein the fourth film layer has a refractive index from about 1.91 to about 1.95;

repeating (e), (f), (g), and (h) until a predetermined number of third film layers and fourth film layers have been deposited, wherein the third film layer is a silicon oxide layer and the fourth film layer is a silicon nitride layer; and forming one or more high aspect ratio features in the one or more silicon oxide/silicon nitride containing stacks using plasma etching techniques, wherein the high aspect ratio feature has a height to width ratio of at least about 5:1 or more.

14. The method of claim 13, wherein the first process gas comprises a silicon-containing gas and an oxygen-containing gas.

15. The method of claim 14, wherein the silicon-containing gas is tetraethyl orthosilicate (TEOS) and the oxygen-containing gas is $N_2O$.

16. The method of claim 15, wherein the second process gas comprises a silicon-containing gas and a nitrogen-containing gas.

17. The method of claim 16, wherein the silicon-containing gas is silane ($SiH_4$) and the nitrogen-containing gas is $NH_3$.

18. The method of claim 13, wherein the second process gas and the fourth process gas each comprise a nitrogen-containing gas and a flow rate of the nitrogen-containing gas in the fourth process gas is increased relative to a flow rate of the nitrogen-containing gas in the second process gas.

19. The method of claim 13, wherein the second process gas and the fourth process gas each comprise a silicon-containing gas and a flow rate of the silicon-containing gas in the fourth process gas is increased relative to a flow rate of the silicon-containing gas in the second process gas.

20. The method of claim 13, wherein the high aspect ratio feature has a height to width ratio of about 10:1 to about 20:1.

* * * * *